United States Patent
Wang et al.

(10) Patent No.: US 8,416,577 B2
(45) Date of Patent: Apr. 9, 2013

(54) CORELESS SUBSTRATE AND METHOD FOR MAKING THE SAME

(75) Inventors: Chien-Hao Wang, Kaohsiung (TW); Ming-Chiang Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 466 days.

(21) Appl. No.: 12/691,502

(22) Filed: Jan. 21, 2010

(65) Prior Publication Data

US 2010/0206618 A1 Aug. 19, 2010

(30) Foreign Application Priority Data

Feb. 16, 2009 (TW) ................................. 98104876 A

(51) Int. Cl.
*H05K 1/00* (2006.01)

(52) U.S. Cl. ........................................ 361/749; 361/792

(58) Field of Classification Search .......... 361/749–751, 361/792–795; 174/262–266
See application file for complete search history.

(56) References Cited

U.S. PATENT DOCUMENTS 6,430,059 B1 * 8/2002 Hung et al. ................. 361/793
2005/0143534 A1 * 6/2005 Dueber et al. .............. 525/476

FOREIGN PATENT DOCUMENTS

| CN | 101257775 | 9/2008 |
| CN | 101351086 | 1/2009 |

OTHER PUBLICATIONS

Office action issued on Mar. 23, 2011, by the Chinese Patent Office in CN 200910118552.1.

* cited by examiner

*Primary Examiner* — Jeremy Norris
(74) *Attorney, Agent, or Firm* — McCracken & Frank LLC

(57) ABSTRACT

The present invention relates to a coreless substrate and a method for making the same. The method for making the coreless substrate includes: (a) providing a carrier and a first conductive layer, wherein the carrier has a first surface and a second surface, and the first conductive layer is disposed on the first surface of the carrier; (b) forming a first embedded circuit on the first conductive layer; (c) forming a first dielectric layer so as to cover the first embedded circuit; (d) removing the carrier; (e) removing part of the first conductive layer so as to form at least one first pad; and (f) forming a first solder mask so as to cover the first embedded circuit and the first dielectric layer and to expose the first pad. Therefore, the coreless substrate of the present invention has high density of layout and involves low manufacturing cost.

14 Claims, 18 Drawing Sheets

CORELESS SUBSTRATE AND METHOD FOR MAKING THE SAME

BACKGROUND OF THE INVENTION

1. Field of the Invention

The present invention relates to a substrate and a method for making the same, and more particularly to a coreless substrate and a method for making the same.

2. Description of the Related Art

FIGS. 1 and 2 show schematic views of a method for making a conventional substrate. First, a core substrate 11 is provided. The core substrate 11 comprises a core layer 111, a first circuit layer 112, a second circuit layer 113 and at least one via 114. The core layer 111 comprises a first surface 1111 and a second surface 1112. The first circuit layer 112 is disposed on the first surface 1111 of the core layer 111. The second circuit layer 113 is disposed on the second surface 1112 of the core layer 111. The via 114 penetrates the core layer 111, and electrically connects the first circuit layer 112 to the second circuit layer 113.

A first dielectric layer 12 and a second dielectric layer 13 are formed on the first circuit layer 112 and the second circuit layer 113, respectively. The first dielectric layer 12 has at least one first opening 121 so as to expose the first circuit layer 112, and the second dielectric layer 13 has at least one second opening 131 so as to expose the second circuit layer 113. Afterward, a first conductive metal 14 is formed on the first dielectric layer 12 and the exposed first circuit layer 112, and a second conductive metal 15 is formed on the second dielectric layer 13 and the exposed second circuit layer 113. Finally, a patterning process and a plating process are conducted so as to form a third circuit layer 16 and at least one first conductive hole 17 on the first conductive metal 14, and a fourth circuit layer 18 and at least one second conductive hole 19 on the second conductive metal 15, and a conventional substrate 1 is formed.

The method for making the conventional substrate 1 has the following disadvantages. The method starts with providing a core substrate 11 which has a certain thickness, so the conventional substrate 1 has low density of layout. Moreover, because the inner structure of the core substrate 11 is formed by drilling, plating, plugging and layout forming, the procedure is complicated and the manufacturing cost is high.

Therefore, it is necessary to provide a coreless substrate and a method for making the same to solve the above problems.

SUMMARY OF THE INVENTION

The present invention is directed to a coreless substrate. The substrate comprises a first dielectric layer, a first embedded circuit, at least one first pad and a first solder mask. The first dielectric layer has a first surface and a second surface. The first embedded circuit is disposed in the first dielectric layer, and is exposed to the first surface. The first pad is disposed on the first surface of the first dielectric layer, and is electrically connected to the first embedded circuit. The first solder mask covers the first surface of the first dielectric layer and the first embedded circuit, and exposes the first pad.

The present invention is further directed to a coreless substrate. The substrate comprises a first dielectric layer, a first embedded circuit, at least one first pad, a first solder mask, at least one first conducting hole, at least one laminated circuit, at least one bottom pad and a bottom solder mask. The first dielectric layer has a first surface and a second surface. The first embedded circuit is disposed in the first dielectric layer, and is exposed to the first surface. The first pad is disposed on the first surface of the first dielectric layer and the first embedded circuit, and is electrically connected to the first embedded circuit. The first solder mask is disposed on the first surface of the first dielectric layer and the first embedded circuit, and exposes the first pad. The first conducting hole is electrically connected to the first embedded circuit. The laminated circuit is disposed under the second surface of the first dielectric layer. The laminated circuit comprises a laminated dielectric layer, a laminated embedded circuit and at least one laminated conducting hole. The laminated dielectric layer has a first surface and a second surface. The laminated embedded circuit is disposed in the laminated dielectric layer, and is exposed to the first surface. The laminated conducting hole is disposed in the laminated dielectric layer, and electrically connects the laminated embedded circuit to the first embedded circuit. The bottom pad is disposed on the surface of the laminated circuit, and is electrically connected to the laminated conducting hole of the laminated circuit. The bottom solder mask is disposed on the surface of the laminated circuit, and exposes the bottom pad.

Therefore, the coreless substrate of the present invention has high density of layout and involves low manufacturing cost. The thickness of a product with the coreless substrate is reduced.

The present invention is further directed to a method for making a coreless substrate. The method comprises the following steps: (a) providing a carrier and a first conductive layer, wherein the carrier has a first surface and a second surface, and the first conductive layer is disposed on the first surface of the carrier; (b) forming a first embedded circuit on the first conductive layer; (c) forming a first dielectric layer so as to cover the first embedded circuit; (d) removing the carrier; (e) removing part of the first conductive layer so as to form at least one first pad; and (1) forming a first solder mask so as to cover the first embedded circuit and the first dielectric layer and to expose the first pad.

DETAILED DESCRIPTION OF THE INVENTION

Figure 1:
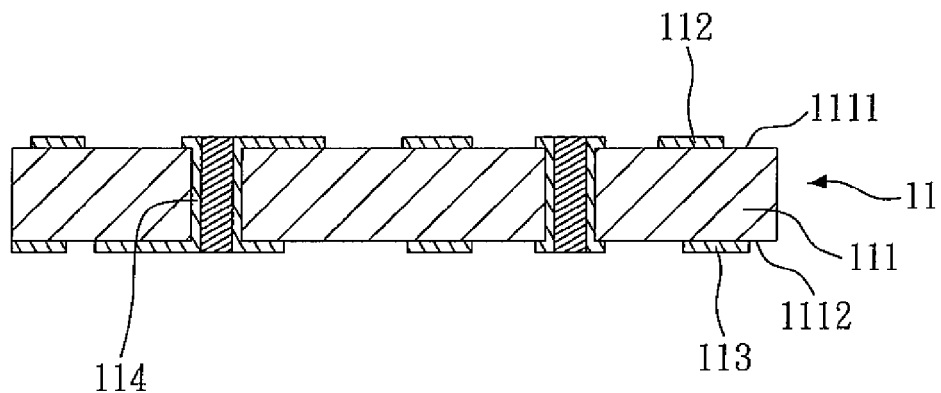
FIGS. 1 and 2 are schematic views of a method for making a conventional substrate.
Figure 2:
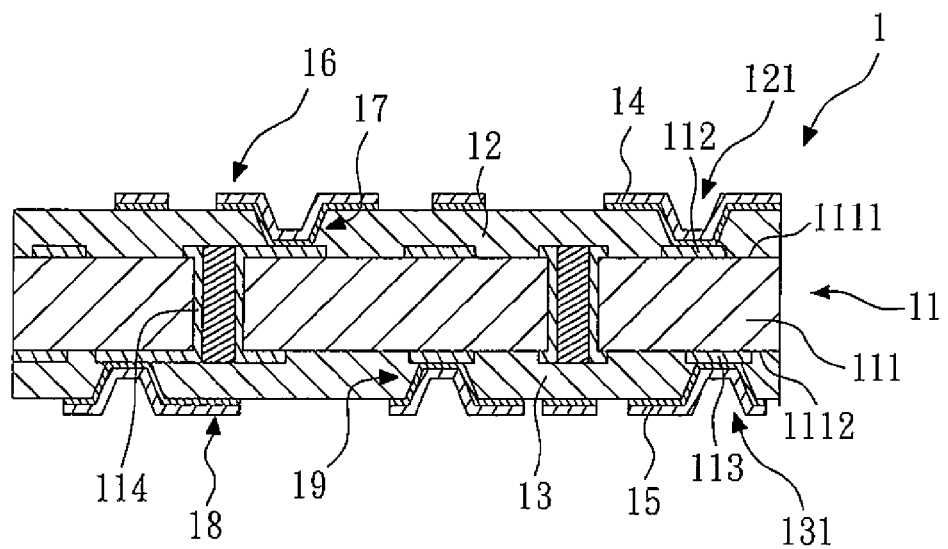
Figure 3:
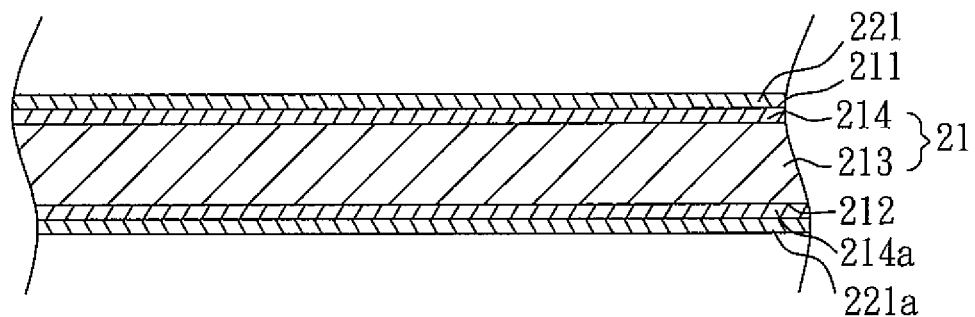
FIGS. 3 to 8 are schematic views of a method for making a coreless substrate according to a first embodiment of the present invention.

FIGS. 3 to 8 show schematic views of a method for making a careless substrate according to a first embodiment of the present invention. As shown in FIG. 3, a carrier 21 and a first conductive layer 221 are provided. The carrier 21 has a first surface 211 and a second surface 212. The first conductive layer 221 is disposed on the first surface 211 of the carrier 21. In the embodiment, the carrier 21 comprises a core layer 213 and a first copper layer 214. The first copper layer 214 is disposed on a surface of the core layer 213, and the first conductive layer 221 covers the first copper layer 214.

In the embodiment, the carrier 21 further has a second copper layer 214a and a bottom conductive layer 221a disposed on the second surface 212 thereof. The second copper layer 214a corresponds to the first copper layer 214, and is processed with the same procedure. The bottom conductive layer 221a corresponds to the first conductive layer 221, and is processed with the same procedure. Therefore, two coreless substrates can be produced simultaneously by a carrier 21. In the embodiment, since the first copper layer 214 and the second copper layer 214a are processed with the same procedure, only the procedure for the first copper layer 214 is illustrated.

Generally, the first conductive layer 221 is used to protect the first copper layer 214 from being scratched. However, in the present invention, there is a certain bonding force between the first conductive layer 221 and the first copper layer 214, while the first conductive layer 221 and the first copper layer 214 can be separated easily. Therefore, after a circuit is formed on the first conductive layer 221 and the carrier 21 is removed from the interface between the first conductive layer 221 and the first copper layer 214 (i.e. the first surface 211 of the carrier 21), a coreless substrate 2 (FIG. 8) is formed. After the carrier 21 is removed, there will be no residues on the surface of the first conductive layer 221, and the carrier 21 can be used again on other products.

Figure 4:
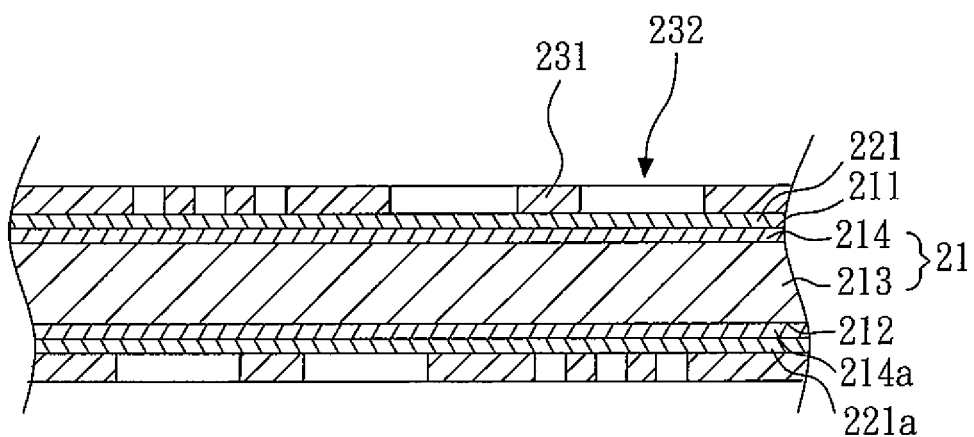
Figure 5:
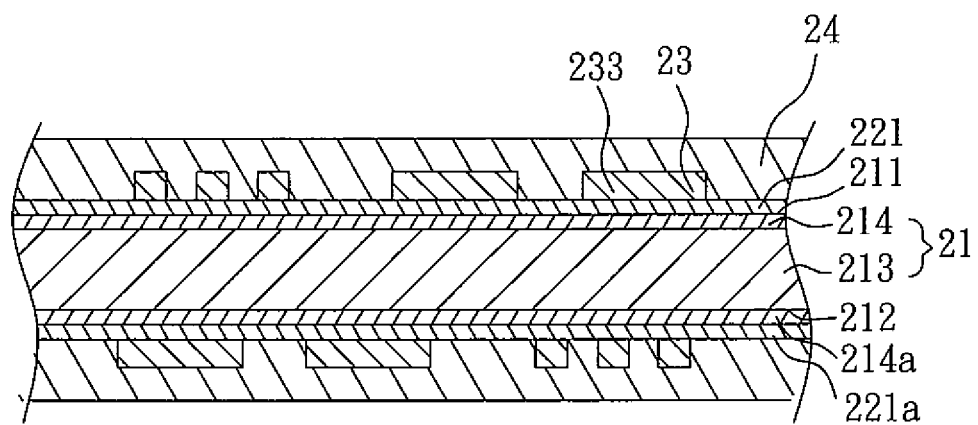
Figure 6:
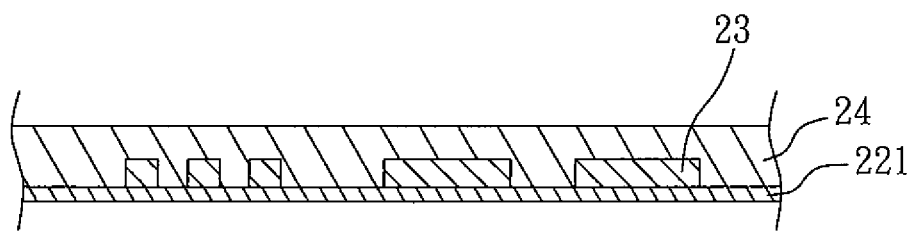

Afterward, a first embedded circuit 23 (FIG. 5) is formed on the first conductive layer 221. The method for forming the first embedded circuit 23 in this embodiment is described as follows. As shown in FIG. 4, a first dry film 231 is formed on the first conductive layer 221, and part of the first dry film 231 is removed so as to form a first pattern 232 and to expose part of the first conductive layer 221. As shown in FIG. 5, a first conductive material 233 is electroplated on the first pattern 232 MG. 4) so as to form the first embedded circuit 23. The first dry film 231 (FIG. 4) is removed. Finally, a first dielectric layer 24 is formed so as to cover the first embedded circuit 23. In other applications, after the first embedded circuit 23 is formed, an oxide layer (not shown) can be formed so as to cover the first embedded circuit 23 and the first conductive layer 221. In this embodiment, the oxide layer is a brown oxide layer or a black oxide layer. As shown in FIG. 6, the carrier 21 (FIG. 5) is removed.

Figure 7:
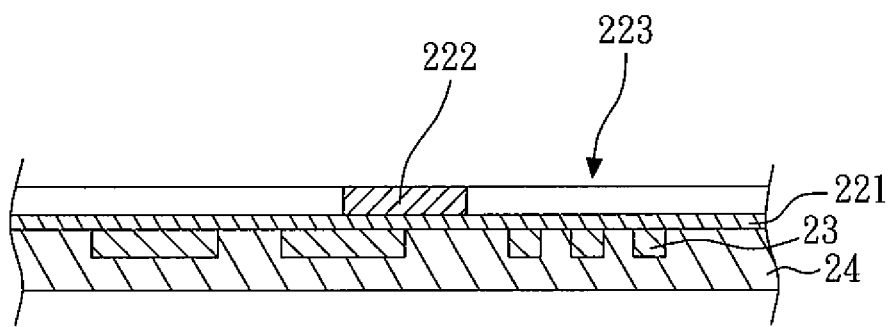
Figure 8:
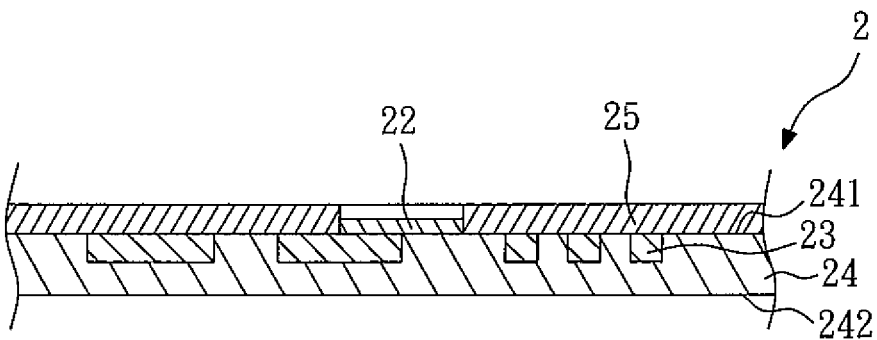

Afterward, after being turned upside down, part of the first conductive layer 221 is removed so as to form at least one first pad 22 (FIG. 8). In the embodiment, the method for forming the first pad 22 is described as follows. As shown in FIG. 7, a second dry film 222 is formed on the first conductive layer 221, and part of the second dry film 222 is removed so as to form a second pattern 223 and to expose part of the first conductive layer 221. As shown in FIG. 8, the exposed first conductive layer 221 (FIG. 7) is etched. The second dry film 222 (FIG. 7) is removed so as to form the first pad 22. Finally, a first solder mask 25 is formed so as to cover the first embedded circuit 23 and the first dielectric layer 24 and to expose the first pad 22. In other applications, a Ni/Au plating layer (not shown) is further formed on the surface of the first pad 22.

FIG. 8 shows a cross-sectional view of a coreless substrate according to a first embodiment of the present invention. The coreless substrate 2 comprises a first dielectric layer 24, a first embedded circuit 23, at least one first pad 22 and a first solder mask 25. The first dielectric layer 24 has a first surface 241 and a second surface 242. The first embedded circuit 23 is disposed in the first dielectric layer 24 and exposed to the first surface 241. The top surface of the first embedded circuit 23 is coplanar with the first surface 241 of the first dielectric layer 24. The first pad 22 is disposed on the first surface 241 of the first dielectric layer 24 and the first embedded circuit 23 and electrically connected to the first embedded circuit 23. That is, a part of the first pad 22 is disposed on the first surface 241 of the first dielectric layer 24 to contact the first dielectric layer 24, and the other part of the first pad 22 is disposed on the first embedded circuit 23 to contact the first embedded circuit 23. The first solder mask 25 is disposed on the first surface 241 of the first dielectric layer 24 and the first embedded circuit 23, and exposes the first pad 22.

Figure 8A:
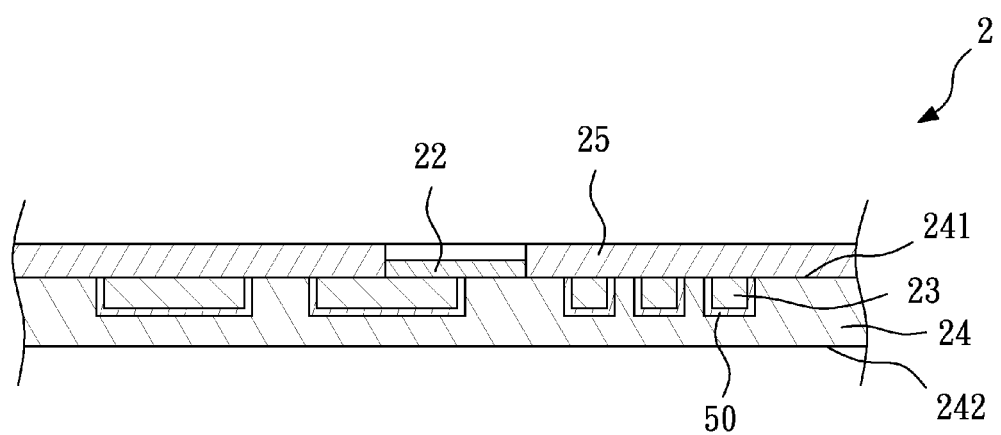
FIG. 8A is a schematic view of a coreless substrate according to another type of the first embodiment of the present invention.

In the embodiment, the first embedded circuit 23 is formed by electroplating, and the material of the first embedded circuit 23 and the first pad 22 is copper. In other applications, the coreless substrate 2 further comprises an oxide layer 50 (FIG. 8A), which is disposed between the first dielectric layer 24 and the first embedded circuit 23. In this embodiment, the oxide layer is a brown oxide layer or a black oxide layer.

Figure 9:
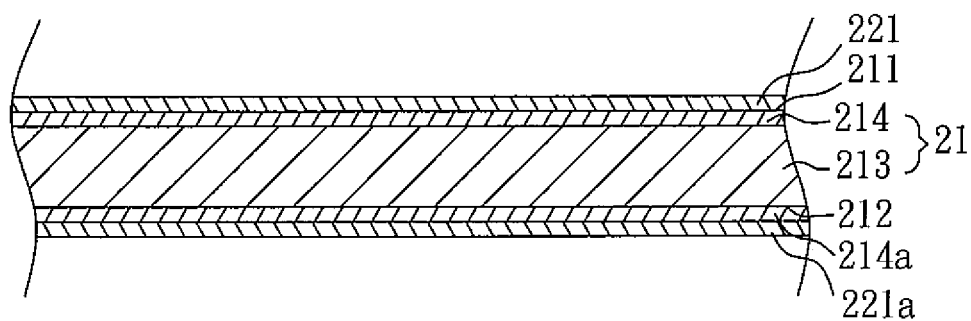
FIGS. 9 to 15 are schematic views of a method for making a coreless substrate according to a second embodiment of the present invention.
Figure 10:
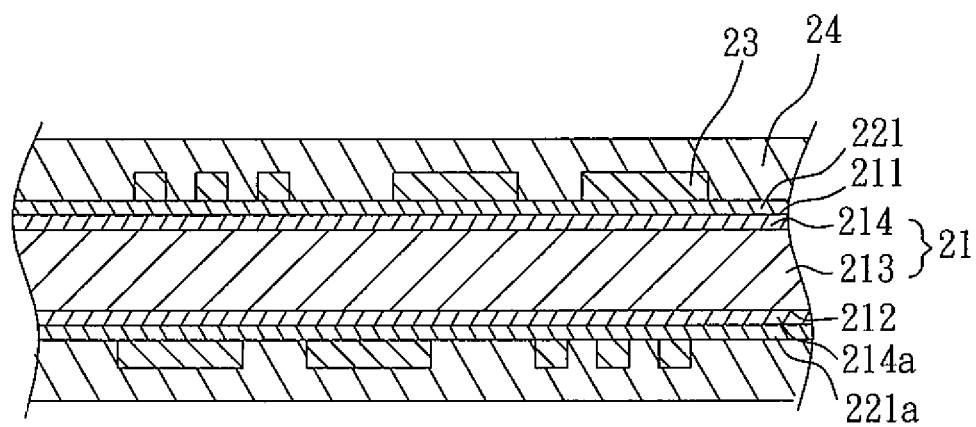
Figure 11:
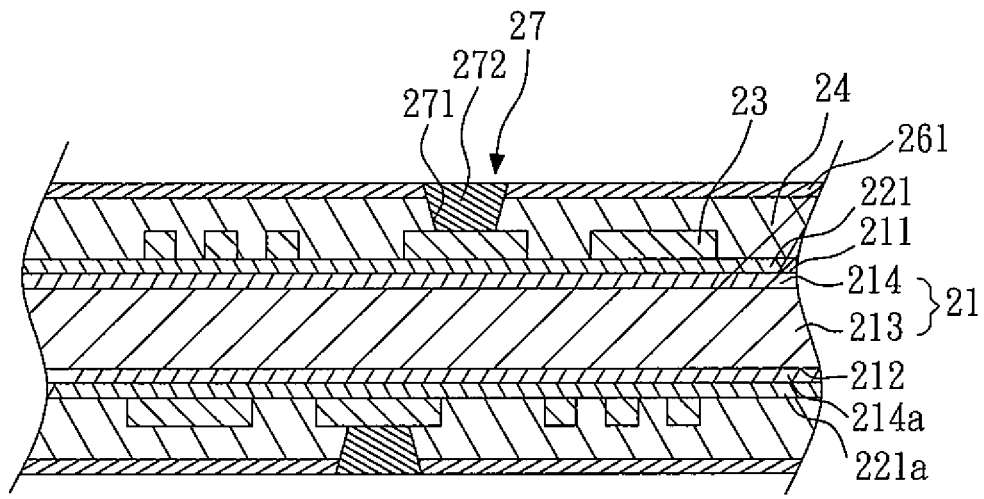
Figure 12:
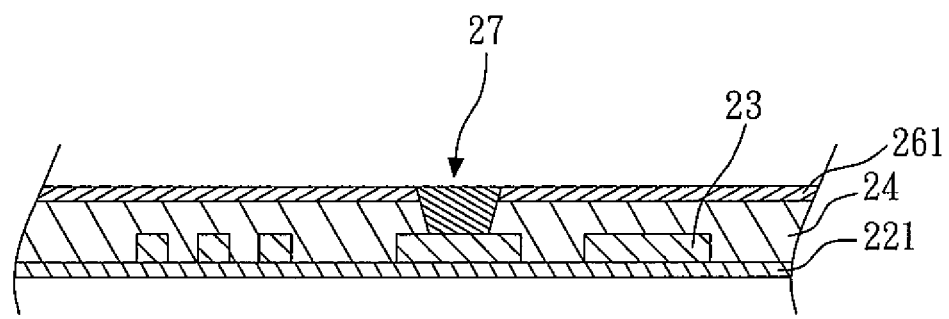

FIGS. 9 to 15 show schematic views of a method for making a coreless substrate according to a second embodiment of the present invention. As shown in FIG. 9, a carrier 21 and a first conductive layer 221 are provided. The carrier 21 has a first surface 211 and a second surface 212. The first conductive layer 221 is disposed on the first surface 211 of the carrier 21. As shown in FIG. 10, a first embedded circuit 23 is formed on the first conductive layer 221, and a first dielectric layer 24 is formed so as to cover the first embedded circuit 23. In the embodiment, after the first dielectric layer 24 is formed, the method further comprises the following steps. As shown in FIG. 11, a second conductive layer 261 is formed on the first dielectric layer 24. Afterward, at least one first hole 271 is formed on the first dielectric layer 24. The first hole 271 penetrates the second conductive layer 261, and exposes part of the first embedded circuit 23. Finally, a second conductive material 272 is formed in the first hole 271 so as to form at least one first conducting hole 27. In the embodiment, the first hole 271 is formed by laser. As shown in FIG. 12, the carrier 21 (FIG. 11) is formed.

Figure 13:
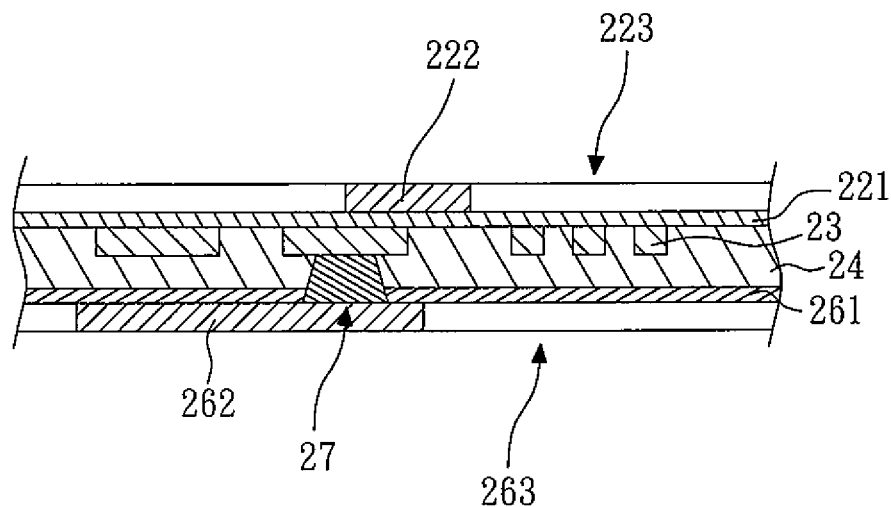
Figure 14:
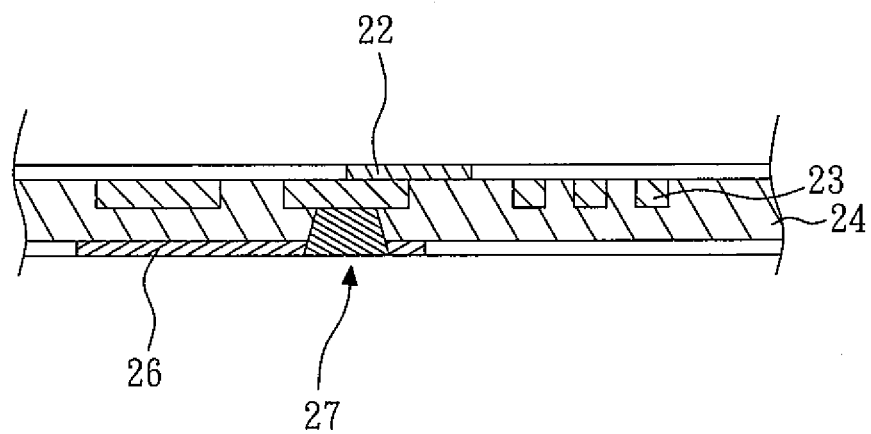

Afterward, after being turned upside down, part of the first conductive layer 221 is removed so as to form at least one first pad 22 (FIG. 14). In the embodiment, part of the second conductive layer 261 is further removed so as to form at least one second pad 26 (FIG. 14). The second pad 26 is electrically connected to the first embedded circuit 23 (FIG. 14) by the first conducting hole 27. The method for forming the first pad 22 and the second pad 26 is described as follows. As shown in FIG. 13, a second dry film 222 and a third dry film 262 is formed on the first conductive layer 221 and the second conductive layer 261, respectively. Then part of the second dry film 222 and part of the third dry film 262 are removed so as to form a second pattern 223 and a third pattern 263, which expose part of the first conductive layer 221 and part of the second conductive layer 261, respectively. As shown in FIG. 14, the exposed first conductive layer 221 (FIG. 13) and the exposed second conductive layer 261 (FIG. 13) are etched. The second dry film 222 (FIG. 13) and the third dry film 262 (FIG. 13) are removed so as to form the first pad 22 and the second pad 26.

Figure 15:
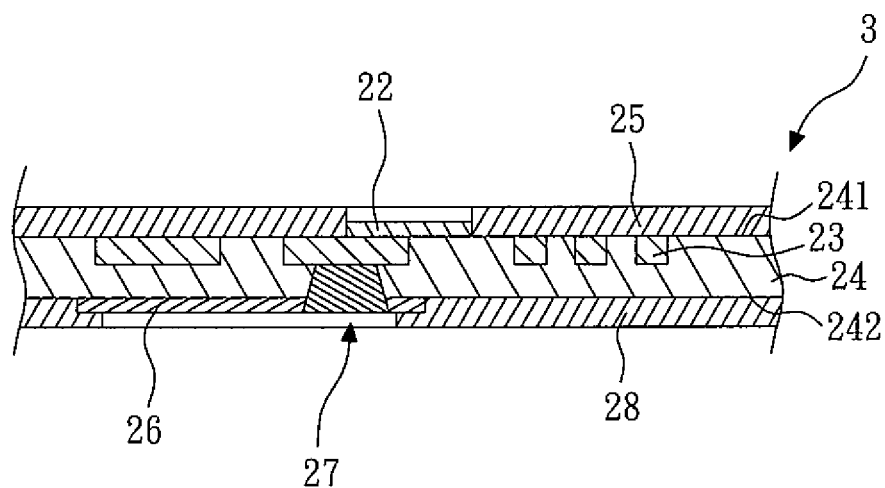

As shown in FIG. 15, a first solder mask 25 is formed so as to cover the first embedded circuit 23 and the first dielectric layer 24 and to expose the first pad 22. In the embodiment, a second solder mask 28 is further formed so as to cover the first dielectric layer 24 and to expose the second pad 26.

FIG. 15 shows a cross-sectional view of a coreless substrate according to a second embodiment of the present invention. The coreless substrate 3 according to the second embodiment is substantially the same as the coreless substrate 2 (FIG. 8) according to the first embodiment, and the same elements are designated by the same reference numbers. The difference between the coreless substrate 3 according to the second embodiment and the coreless substrate 2 according to the first embodiment is that the substrate 3 further comprises at least one second pad 26, at least one first conducting hole 27 and a second solder mask 28. In the embodiment, the second pad 26 is disposed on the second surface 242 of the first dielectric layer 24, and the material of the second pad 26 is copper. The first conducting hole 27 is disposed in the first dielectric layer 24, and electrically connects the second pad 26 to the first embedded circuit 23. The material of the first conducting hole 27 is copper. The second solder mask 28 is disposed on the second surface 242 of the first dielectric layer 24, and exposes the second pad 26.

Figure 16:
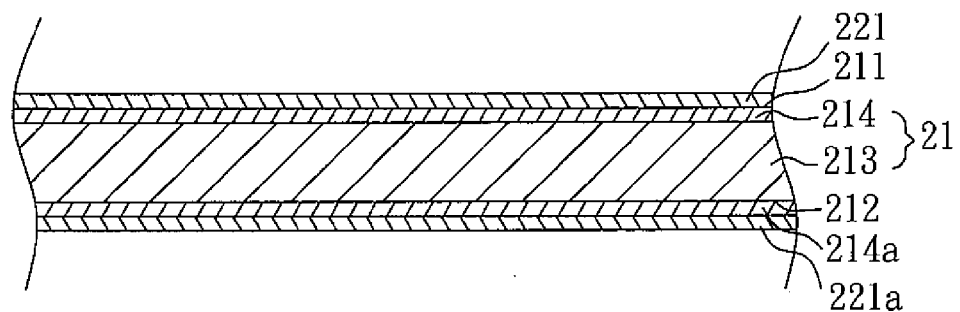
FIGS. 16 to 29 are schematic views of a method for making a coreless substrate according to a third embodiment of the present invention.

FIGS. 16 to 29 show schematic views of a method for making a coreless substrate according to a third embodiment of the present invention. As shown in FIG. 16, a carrier 21 and a first conductive layer 221 are provided. The carrier 21 has a first surface 211 and a second surface 212. The first conductive layer 221 is disposed on the first surface 211 of the carrier 21.

Figure 17:
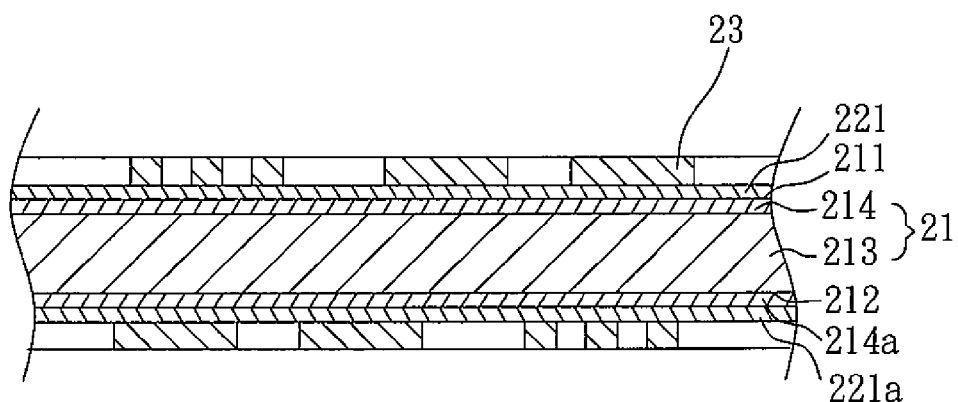
Figure 18:
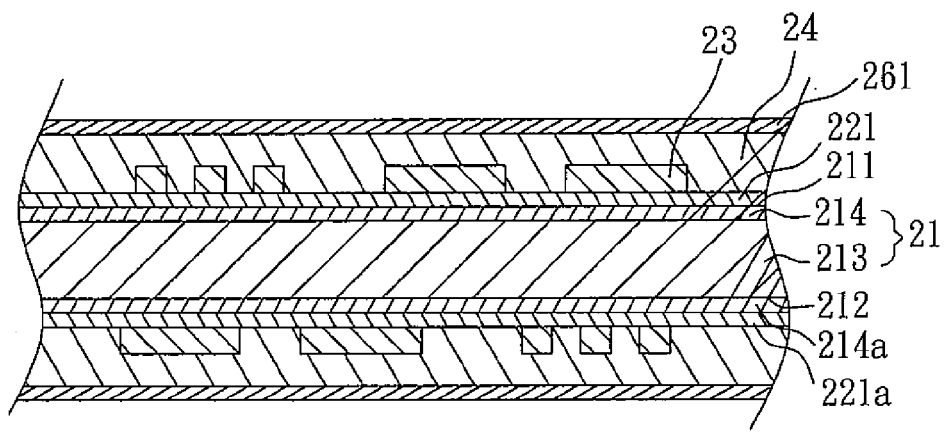
Figure 19:
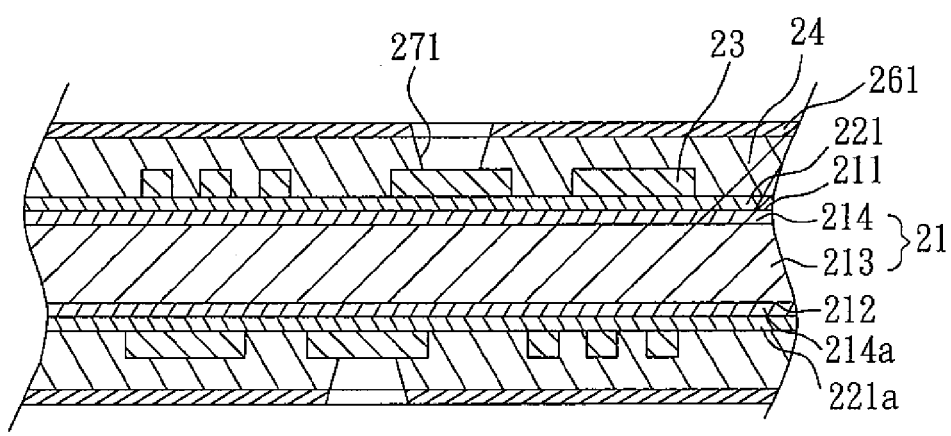

As shown in FIG. 17, a first embedded circuit 23 is formed on the first conductive layer 221. As shown in FIG. 18, a first dielectric layer 24 is formed so as to cover the first embedded circuit 23, and a second conductive layer 261 is formed on the first dielectric layer 24. As shown in FIG. 19, at least one first hole 271 is formed on the first dielectric layer 24. The first hole 271 penetrates the second conductive layer 261, and exposes part of the first embedded circuit 23. The first hole 271 is formed by laser.

Figure 20:
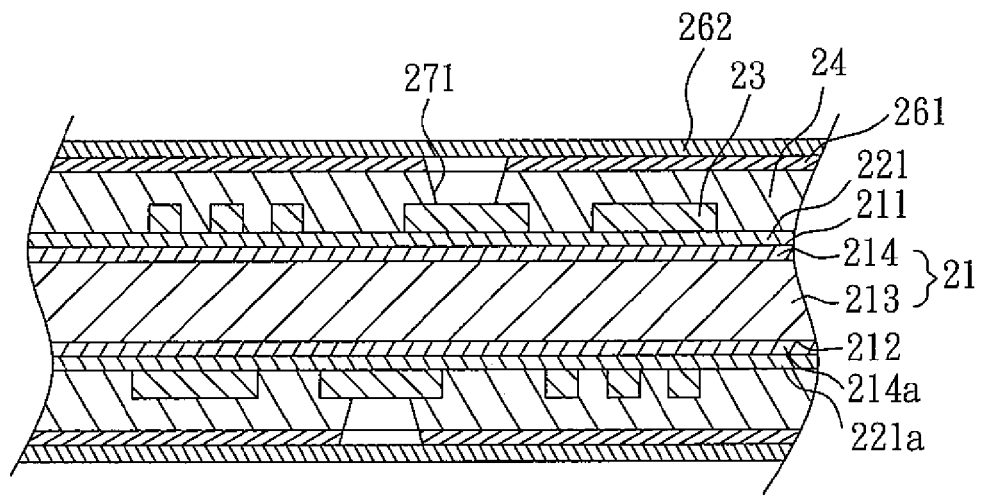
Figure 21:
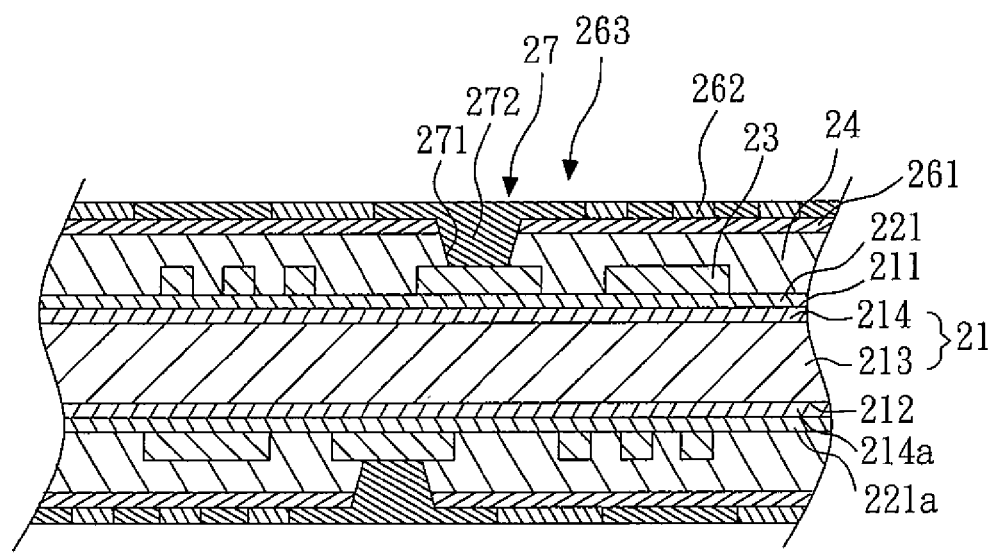
Figure 22:
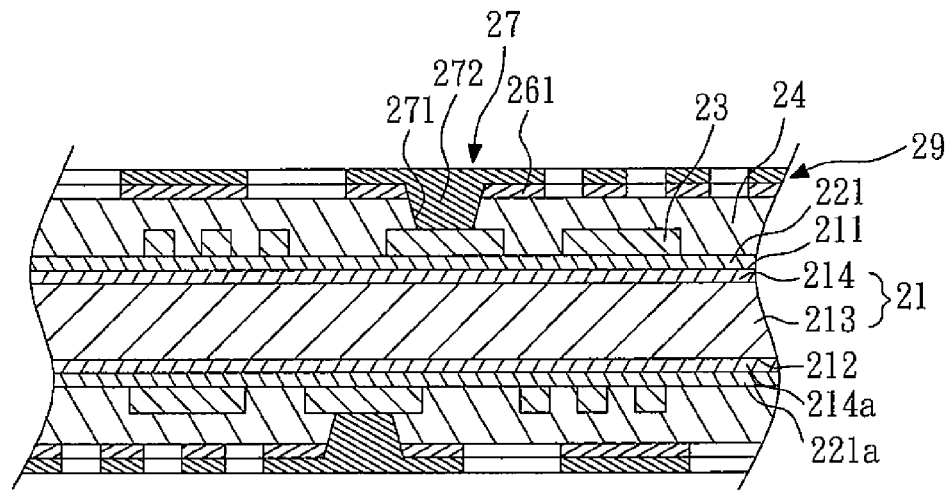

Afterward, at least one first conducting hole 27 and a second embedded circuit 29 (FIG. 22) are formed by the method described as follows. As shown in FIG. 20, a third dry film 262 is formed on the second conductive layer 261. As shown in FIG. 21, part of the third dry film 262 is removed so as to form a third pattern 263, which exposes part of the second conductive layer 261 and the first hole 271. The second conductive material 272 is formed on the second conductive layer 261 and in the first hole 271 so as to form the first conducting hole 27. As shown in FIG. 22, the third dry film 262 (FIG. 21) is removed so as to expose part of the second conductive layer 261. The exposed second conductive layer 261 is etched so as to form the second embedded circuit 29. The second embedded circuit 29 comprises the second conductive layer 261 and the second conductive material 272. Preferably, the material of the second conductive material 272 is the same as that of the second conductive layer 261, so that the interface between the second conductive layer 261 and the second conductive material 272 is not conspicuous and the second embedded circuit 29 looks like a single layer. The second embedded circuit 29 is electrically connected to the first embedded circuit 23 by the first conducting hole 27.

Figure 23:
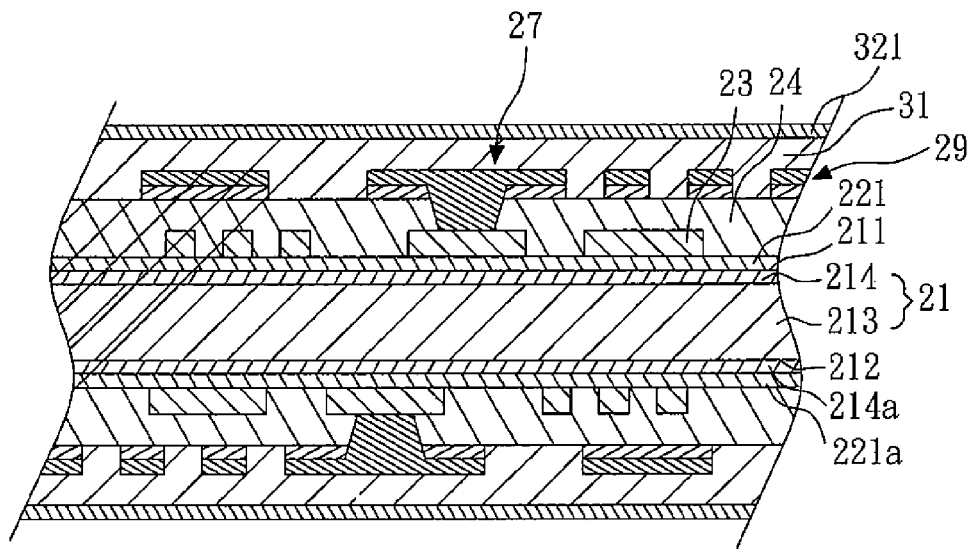
Figure 24:
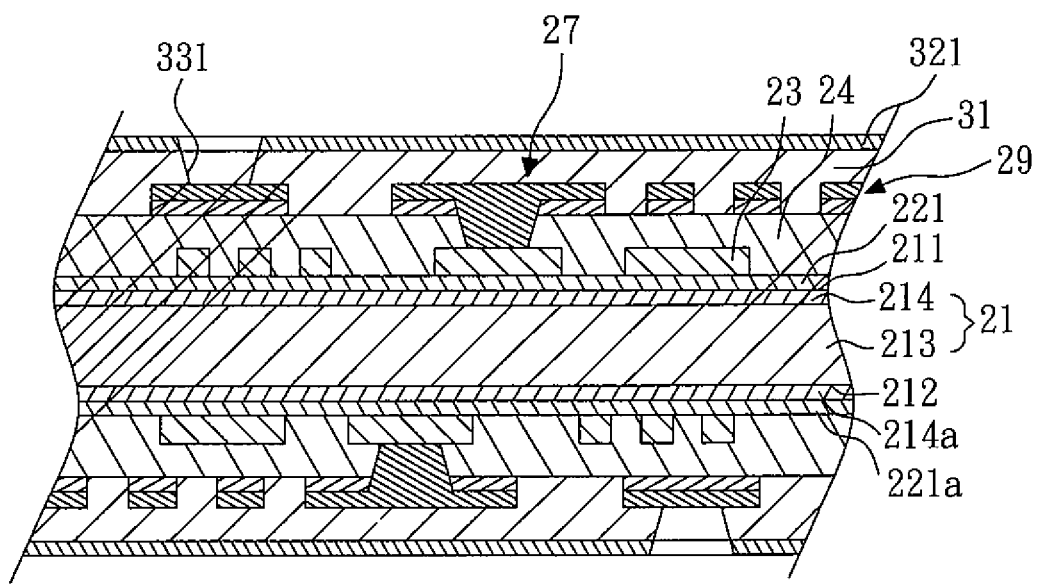

In the embodiment, a first laminated circuit 30 (FIG. 25) is further formed by the method described as follows. As shown in FIG. 23, a second dielectric layer 31 is formed so as to cover the second embedded circuit 29, and a third conductive layer 321 is formed on the second dielectric layer 31. As shown in FIG. 24, at least one second hole 331 is formed on the second dielectric layer 31. The second hole 331 penetrates the third conductive layer 321, and exposes part of the second embedded circuit 29.

Figure 25:
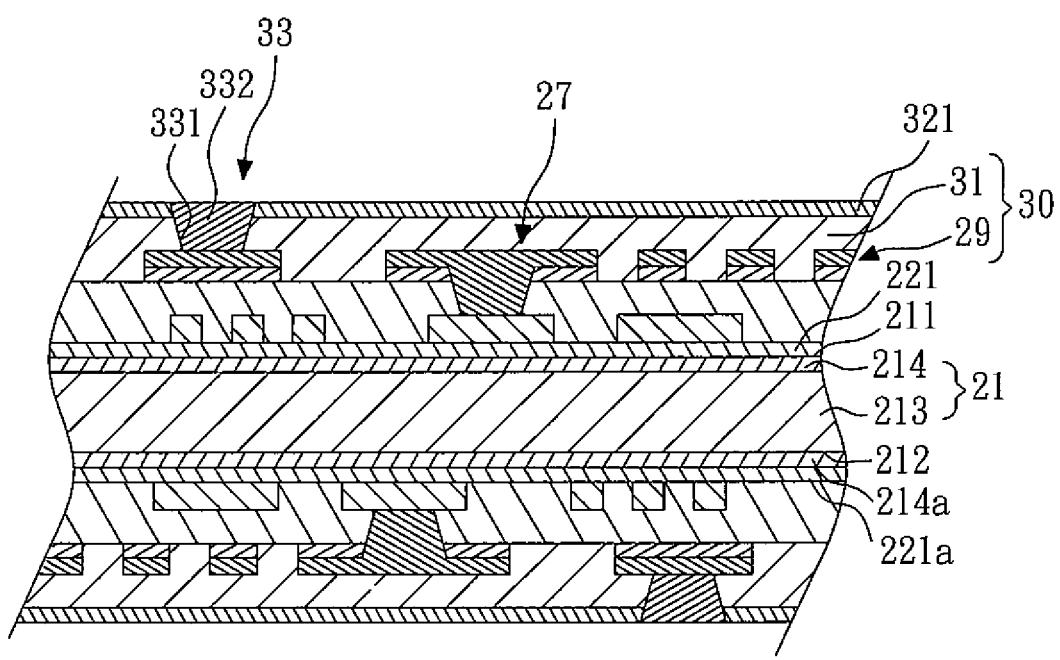

As shown in FIG. 25, a third conductive material 332 is formed in the second hole 331 so as to form at least one second conducting hole 33, and meanwhile the first laminated circuit 30 is also formed. In the embodiment, the first laminated circuit 30 comprises a laminated dielectric layer (second dielectric layer 31, FIG. 25), a laminated embedded circuit (second embedded circuit 29, FIG. 25) and at least one laminated conducting hole (second conducting hole 33, FIG. 25).

Figure 26:
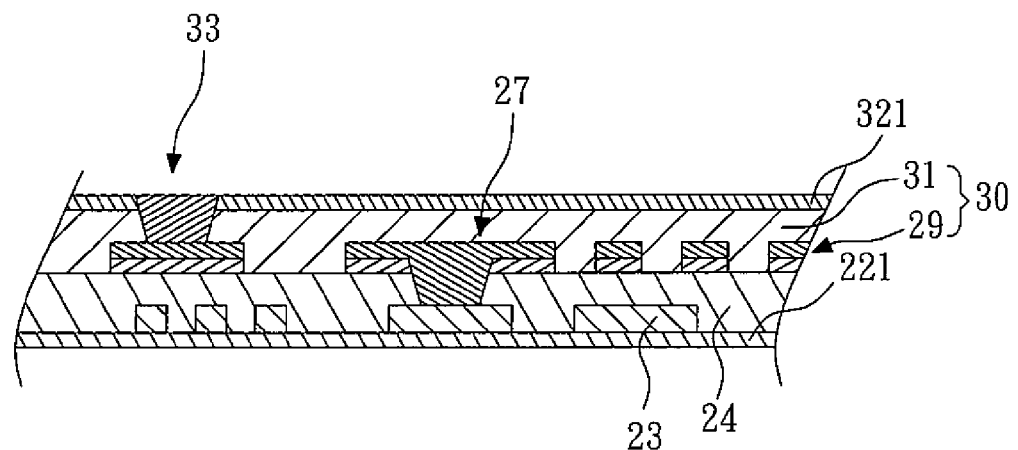
Figure 27:
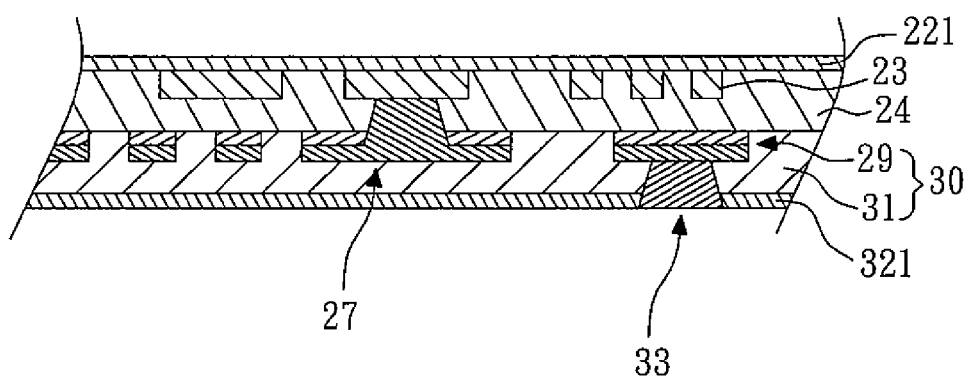
Figure 28:
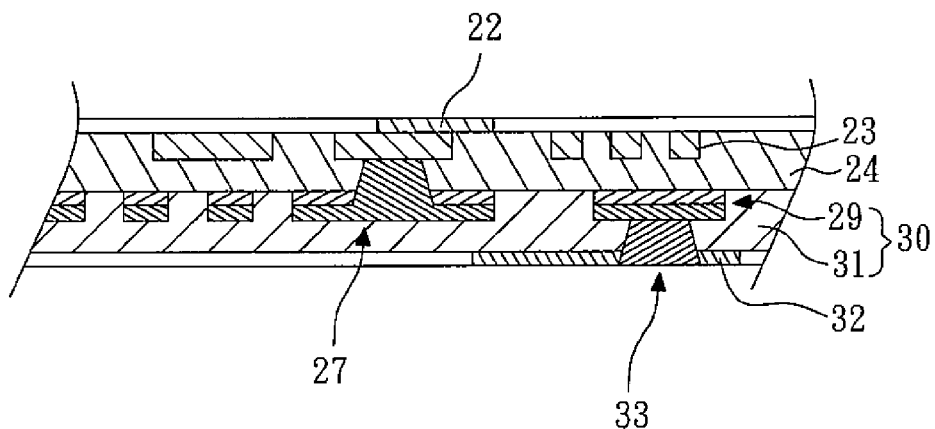
Figure 29:
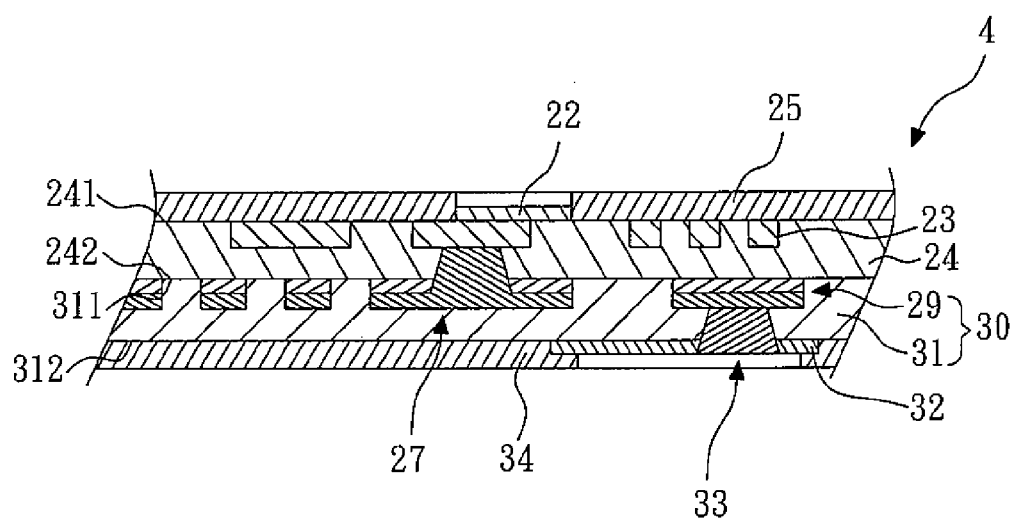

In FIG. 26, the carrier 21 (FIG. 25) is removed, and then turned upside down, as shown in FIG. 27. As shown in FIG. 28, part of the first conductive layer 221 (FIG. 27) is removed so as to form at least one first pad 22. In the embodiment, part of the third conductive layer 321 (FIG. 27) is further removed so as to form at least one bottom pad (third pad 32). The third pad 32 is electrically connected to the second embedded circuit 29 by the second conducting hole 33. As shown in FIG. 29, a first solder mask 25 is formed so as to cover the first embedded circuit 23 and the first dielectric layer 24 and to expose the first pad 22. In the embodiment, a bottom solder mask (third solder mask 34) is further formed so as to cover the second dielectric layer 31 and to expose the third pad 32.

In the embodiment, only one laminated circuit (the first laminated circuit 30) is formed. However, in other applications, after the first laminated circuit 30 is formed, the steps in FIGS. 22 to 25 can be repeated so as to form the coreless substrate 5 shown in FIG. 30, which has multi-laminated circuits (first laminated circuit 30 and second laminated circuit 40).

FIG. 29 shows a cross-sectional view of a coreless substrate according to a third embodiment of the present invention. The coreless substrate 4 comprises a first dielectric layer 24, a first embedded circuit 23, at least one first pad 22, a first solder mask 25, at least one first conducting hole 27, at least one laminated circuit (first laminated circuit 30), at least one bottom pad (third pad 32) and a bottom solder mask (third solder mask 34).

The first dielectric layer 24 has a first surface 241 and a second surface 242. The first embedded circuit 23 is disposed in the first dielectric layer 24, and exposed to the first surface 241. The first pad 22 is disposed on the first surface 241 of the first dielectric layer 24 and the first embedded circuit 23, and electrically connected to the first embedded circuit 23. The first solder mask 25 is disposed on the first surface 241 of the first dielectric layer 24 and the first embedded circuit 23, and exposes the first pad 22. The first conducting hole 27 electrically connects the first embedded circuit 23 and the laminated circuit (first laminated circuit 30).

The laminated circuit is disposed under the second surface 242 of the first dielectric layer 24, and comprises a laminated dielectric layer, a laminated embedded circuit and at least one laminated conducting hole. In the embodiment, the coreless substrate 4 has only one laminated circuit, which is a first laminated circuit 30. The first laminated circuit 30 comprises a laminated dielectric layer (second dielectric layer 31), a laminated embedded circuit (second embedded circuit 29) and at least one laminated conducting hole (second conducting hole 33). The second dielectric layer 31 has a first surface 311 and a second surface 312. The second embedded circuit 29 is disposed in the second dielectric layer 31, and exposed to the first surface 311. The second conducting hole 33 is disposed in the second dielectric layer 31, and electrically connected to the second embedded circuit 29.

The bottom pad (third pad 32) is disposed on the surface of the first laminated circuit 30, and electrically connected to the second conducting hole 27 of the first laminated circuit 30. The bottom solder mask (third solder mask 34) is disposed on the surface of the first laminated circuit 30, and exposes the bottom pad (third pad 32).

Figure 30:
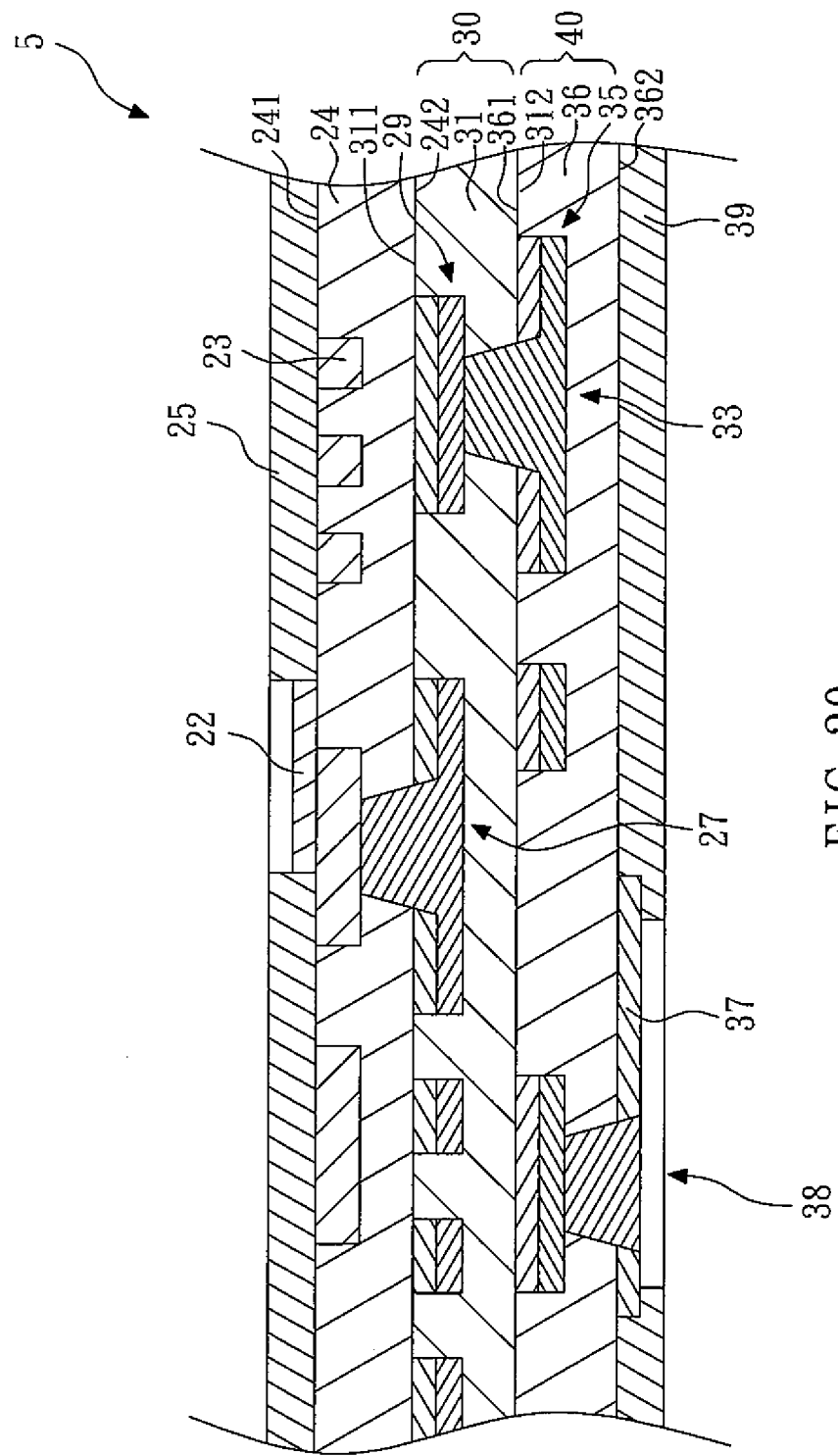
FIG. 30 is a cross-sectional view of a coreless substrate according to a fourth embodiment of the present invention.

FIG. 30 shows a cross-sectional view of a coreless substrate according to a fourth embodiment of the present invention. The coreless substrate 5 according to the fourth embodiment is substantially the same as the coreless substrate 4

(FIG. 29) according to the third embodiment, and the same elements are designated by the same reference numbers. The difference between the coreless substrate 5 according to the fourth embodiment and the coreless substrate 4 according to the third embodiment is that the substrate 5 further comprises a second laminated circuit 40, the bottom pad is a fourth pad 37, and the bottom solder mask is a fourth solder mask 39.

The second laminated circuit 40 is disposed on the surface of the first laminated circuit 30, and comprises a laminated dielectric layer (third dielectric layer 36), a laminated embedded circuit (third embedded circuit 35) and at least one laminated conducting hole (third conducting hole 38). The third dielectric layer 36 has a first surface 361 and a second surface 362. The third embedded circuit 35 is disposed in the third dielectric layer 36, and exposed to the first surface 361. The third conducting hole 38 is disposed in the third dielectric layer 36, and electrically connected to the third embedded circuit 35. The bottom pad (fourth pad 37) is disposed on the surface of the second laminated circuit 40, and electrically connected to the third conducting hole 38 of the second laminated circuit 40. The bottom solder mask (fourth solder mask 39) is disposed on the surface of the second laminated circuit 40, and exposes the bottom pad (fourth pad 37).

Therefore, the coreless substrates 2, 3, 4, 5 of the present invention have high density of layout and involve low manufacturing cost. The thickness of a product with the coreless substrate is reduced.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A coreless substrate, comprising:
   a first dielectric layer having a first surface and a second surface;
   a first embedded circuit disposed in the first dielectric layer, and exposed to the first surface;
   at least one first pad electrically connected to the first embedded circuit, wherein a part of the at least one first pad is disposed on the first surface of the first dielectric layer, and the other part of the at least one first pad is disposed on the first embedded circuit; and
   a first solder mask covering the first surface of the first dielectric layer and the first embedded circuit, and exposing the first pad.

2. The substrate as claimed in claim 1, further comprising an oxide layer, wherein the oxide layer is disposed between the first dielectric layer and the first embedded circuit.

3. The substrate as claimed in claim 1, wherein the first embedded circuit is formed by electroplating.

4. The substrate as claimed in claim 1, further comprising:
   at least one second pad disposed on the second surface of the first dielectric;
   at least one first conducting hole disposed in the first dielectric layer, and electrically connecting the second pad to the first embedded circuit; and
   a second solder mask covering the second surface of the first dielectric layer, and exposing the second pad.

5. The substrate as claimed in claim 1, wherein the first pad is further disposed on the first embedded circuit.

6. The substrate as claimed in claim 1, wherein the material of the first embedded circuit and the first pad is copper.

7. A coreless substrate, comprising:
   a first dielectric layer having a first surface and a second surface;
   a first embedded circuit disposed in the first dielectric layer, and exposed to the first surface;
   at least one first pad electrically connected to the first embedded circuit, wherein a part of the at least one first pad is disposed on the first surface of the first dielectric layer, and the other part of the at least one first pad is disposed on the first embedded circuit;
   a first solder mask disposed on the first surface of the first dielectric layer and the first embedded circuit, and exposing the first pad;
   at least one first conducting hole electrically connecting the first embedded circuit;
   at least one laminated circuit disposed under the second surface of the first dielectric layer, the laminated circuit comprising:
      a laminated dielectric layer having a first surface and a second surface;
      a laminated embedded circuit disposed in the laminated dielectric layer, and exposed to the first surface; and
      at least one laminated conducting hole disposed in the laminated dielectric layer, and electrically connecting the laminated embedded circuit to the first embedded circuit;
   at least one bottom pad disposed on the surface of the laminated circuit, and electrically connected to the laminated conducting hole of the laminated circuit; and
   a bottom solder mask disposed on the surface of the laminated circuit, and exposing the bottom pad.

8. The coreless substrate as claimed in claim 7, wherein the first conducting hole electrically connects the first embedded circuit and the laminated circuit.

9. A coreless substrate, comprising:
   a first dielectric layer having a first surface and a second surface;
   a first embedded circuit disposed in the first dielectric layer, and exposed to the first surface;
   at least one first pad electrically connected to the first embedded circuit, wherein a part of the at least one first pad is disposed on the first surface of the first dielectric layer, and the other part of the at least one first pad is disposed on the first embedded circuit;
   a first solder mask disposed on the first surface of the first dielectric layer and the first embedded circuit, and exposing the first pad;
   at least one first conducting hole electrically connecting the first embedded circuit;
   a plurality of laminated circuits disposed under the second surface of the first dielectric layer;
   at least one bottom pad disposed on the surface of the laminated circuits; and
   a bottom solder mask disposed on the surface of the laminated circuits, and exposing the bottom pad.

10. The cureless substrate as claimed in claim 9, wherein the first conducting hole electrically connects the first embedded circuit and the laminated circuits.

11. The coreless substrate as claimed in claim 9, wherein each of the laminated circuits comprises:
   a laminated dielectric layer having a first surface and a second surface;
   a laminated embedded circuit disposed in the laminated dielectric layer, and exposed to the first surface; and at least one laminated conducting hole disposed in the laminated dielectric layer, and electrically connecting the laminated embedded circuit to the first embedded circuit;

wherein the bottom pad is electrically connected to the laminated conducting hole.

12. The coreless substrate as claimed in claim 9, wherein the laminated circuits comprises a first laminated circuit and a second laminated circuit, and the first laminated circuit comprises:
- a second dielectric layer having a first surface and a second surface;
- a second embedded circuit disposed in the second dielectric layer, and exposed to the first surface; and
- at least one second conducting hole disposed in the second dielectric layer, and electrically connecting the second embedded circuit to the first embedded circuit.

13. The coreless substrate as claimed in claim 12, wherein the second laminated circuit is disposed on the first laminated circuit, and comprises:
- a third dielectric layer having a first surface and a second surface;
- a third embedded circuit disposed in the third dielectric layer, and exposed to the first surface; and
- at least one third conducting hole disposed in the third dielectric layer, and electrically connecting the third embedded circuit.

14. The careless substrate as claimed in claim 13, wherein the bottom pad is disposed on the surface of the second laminated circuit, and electrically connected to the third conducting hole of the second laminated circuit; the bottom solder mask is disposed on the surface of the second laminated circuit, and exposes the bottom pad.

* * * * *